US008373847B2

(12) United States Patent
Patra et al.

(10) Patent No.: US 8,373,847 B2
(45) Date of Patent: Feb. 12, 2013

(54) POLARIZATION ACTUATOR

(75) Inventors: Michael Patra, Oberkochen (DE);
Martin Meier, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 13/281,179

(22) Filed: Oct. 25, 2011

(65) Prior Publication Data

US 2012/0099093 A1    Apr. 26, 2012

(30) Foreign Application Priority Data

Oct. 26, 2010   (DE) .......................... 10 2010 042 901

(51) Int. Cl.
*G03B 27/72* (2006.01)
*G03B 27/54* (2006.01)
(52) U.S. Cl. .......................................... 355/71; 355/67
(58) Field of Classification Search .................. 355/53, 355/55, 67–71; 362/254, 393
See application file for complete search history.

(56) References Cited

U.S. PATENT DOCUMENTS

| | | | | |
|---|---|---|---|---|
| 5,087,985 | A * | 2/1992 | Kitaura et al. | 359/350 |
| 6,404,499 | B1 | 6/2002 | Stoeldraijer et al. | |
| 6,535,274 | B2 | 3/2003 | Antoni | 355/67 |
| 7,551,263 | B2 * | 6/2009 | Gruner et al. | 355/71 |
| 7,697,116 | B2 * | 4/2010 | Dierichs et al. | 355/71 |
| 7,817,361 | B2 * | 10/2010 | Mimura et al. | 359/885 |
| 7,999,916 | B2 * | 8/2011 | Heil | 355/67 |
| 8,025,427 | B2 * | 9/2011 | Maul et al. | 362/293 |
| 2004/0239904 | A1 | 12/2004 | Nishinaga | |

FOREIGN PATENT DOCUMENTS

| | | |
|---|---|---|
| DE | 100 43 315 C1 | 6/2002 |
| JP | 2000-058442 | 2/2000 |
| JP | 2001-313250 | 11/2001 |
| JP | 2002-072361 | 3/2002 |
| JP | 2002-093700 | 3/2002 |
| JP | 2002-100561 | 4/2002 |

OTHER PUBLICATIONS

German Office Action, with english translation, for corresponding DE Appl. No. 10 2010 042 901.5, dated Jun. 7, 2011.
Japanese Office Action and English Translation of Japanese Office Action, for the corresponding Japanese Patent Application No. 2011-226221, dated Jan. 27, 2012.

\* cited by examiner

*Primary Examiner* — Hung Henry Nguyen
(74) *Attorney, Agent, or Firm* — Fish & Richardson P.C.

(57) ABSTRACT

The present invention relates to an apparatus for influencing a light beam arrangement comprising a plurality of light beams (4) arranged alongside one another, wherein provision is made of at least one optical element (5, 15, 25) which is movable transversely with respect to the light beams and by which the light beams can be influenced if the light beams pass through the optical element, and which has at least one light-absorbing region (9, 19, 29), wherein the apparatus comprises a drive device for the optical element, a measuring device for detecting the light of the light beam and a control unit, wherein the control unit is designed such that the drive device is controlled in a manner dependent on the position of the light-absorbing region. Furthermore, the present invention also relates to a projection exposure apparatus for microlithography comprising a multi-mirror array, in which the corresponding apparatus can be used, and to a method for operating the corresponding apparatus or the projection exposure apparatus.

8 Claims, 5 Drawing Sheets

POLARIZATION ACTUATOR

CROSS-REFERENCE TO RELATED APPLICATIONS

This application claims benefit under 35 USC 119 of German Application No. 10 2010 042 901.5, filed Oct. 26, 2010. The contents of this application are hereby incorporated by reference in its entirety.

BACKGROUND

The disclosure relates to an apparatus for influencing a light beam arrangement that includes a plurality of light beams arranged alongside one another, and to a projection exposure apparatus for microlithography that includes a multi-mirror array, which is illuminated by a plurality of light beams. Furthermore, the disclosure relates to a method for influencing a light beam arrangement including a plurality of light beams arranged alongside one another, more particularly influencing with regard to changing the polarization direction.

Projection exposure apparatuses for microlithography are used for producing structures having extremely small dimensions in microelectronics or in nanotechnology. Accordingly, it is desirable that structures can be imaged with extremely high accuracy. For this purpose, actuators often have to be used in projection exposure apparatuses for microlithography in order to position specific components exactly.

One example is afforded in the case of an illumination unit in which a multiplicity of light beams arranged alongside one another in two dimensions are directed onto an array of micro mirrors of a multi-mirror array, which are likewise arranged alongside one another two-dimensionally here, in order to shape a corresponding illumination beam. In an illumination unit of this type, the polarization direction of the individual light beams is intended to be altered. For this purpose, polarizers, for example in the form of polarization rotator plates, have to be positioned in the beam path of the light beam arrangement or in the beam paths of the individual light beams.

The exact positioning of corresponding components in optical apparatuses described above can involve highly complex solutions and thus high costs.

SUMMARY

A simple solution for the positioning and arrangement of optical elements in a projection exposure apparatus for microlithography is desired. More particularly, a simple solution is desired for the arrangement of an optical element for influencing a light beam arrangement that includes a plurality of light beams arranged alongside one another.

Simple and exact positioning of an optical element for influencing a light beam arrangement that includes a plurality of light beams arranged alongside one another can be achieved by using a measuring device to detect a change in intensity due to a light-absorbing region arranged at the optical element, and the arrangement of the optical element can be controlled in this way.

Accordingly, an apparatus for influencing a light beam arrangement is proposed, in which provision is made of at least one optical element which is movable transversely with respect to the light beams and which has at least one light-absorbing region. In this case, the arrangement of the light beams in the light beam arrangement can be not only alongside one another one-dimensionally, but alongside one another two-dimensionally. Furthermore, light is understood to mean not only light in the visible wavelength range, but generally electromagnetic radiation. By virtue of the movability of the optical element transversely with respect to the light beams, that is to say transversely with respect to the beam direction of the light beam arrangement, the optical element can be moved into the beam path of the light beam arrangement or into individual beam paths of the light beams in order to influence the corresponding light beams during transmission through the optical element. If the optical element has a light-absorbing region then the light-absorbing region gives rise to shading in the further beam path, which can be detected by a measuring device. Thus, the corresponding location of the light-absorbing region can be determined and the drive of the optical element can be correspondingly controlled by means of a control unit. The direct detection of the position of the optical element makes it possible to design the drive device for the optical element in a simple fashion and thus to keep low the complexity for the actuator for moving and positioning the optical element.

In particular, a plurality of optical elements can also be arranged one behind another in the beam direction of the light beams, which are movable individually or altogether. In the case of a common movement of the plurality of optical elements, a light-absorbing region on one of the optical elements suffices, whereas in the case of individual movability of the optical elements, each of the optical elements should have at least one light-absorbing region.

In this case, the light-absorbing regions can be arranged at the same location in each case at the individual optical elements or they can differ in their position such that an overlap of the light-absorbing regions in the beam direction of the light beams does not occur in any position of the optical elements, that is to say that an overlap of the light-absorbing regions in the beam direction of the light beams is avoided in the case of any combination of the possibilities for the arrangement of the optical elements in the beam path. A simple identification of the position of the individual optical elements is possible as a result.

A simple drive device, such as a stepper motor, for example, can be used for the exact positioning of the optical element.

The optical element can be, more particularly, a polarizer, preferably in the form of a pole rotator plate, which is used in an illumination unit of a projection exposure apparatus for setting the polarization of light beams directed onto a multi-mirror array.

Accordingly, an apparatus can be used (e.g., in a projection exposure apparatus for microlithography including a multi-mirror array) that is illuminated by a plurality of light beams arranged alongside one another, wherein, in a pupil plane of the projection exposure apparatus, exactly one region in each case is assigned to a plurality of light beams. More particularly, corresponding regions in a pupil plane can be assigned to the light beams which are intended to be influenced. Consequently, a measuring device for measuring the light intensity can be provided in the pupil plane. More particularly, it is also possible to use a measuring device which is already used for other purposes in the region of the pupil plane of a projection exposure apparatus. In this way, the outlay for the exact positioning of the polarizers in an illumination unit of a projection exposure apparatus can be reduced further.

BRIEF DESCRIPTION OF THE FIGURES

In the accompanying drawings, in a purely schematic manner.

DETAILED DESCRIPTION

Further advantages, characteristics and features will become clear in the course of the following detailed description of exemplary embodiments with reference to the accompanying drawings.

Figure 1:
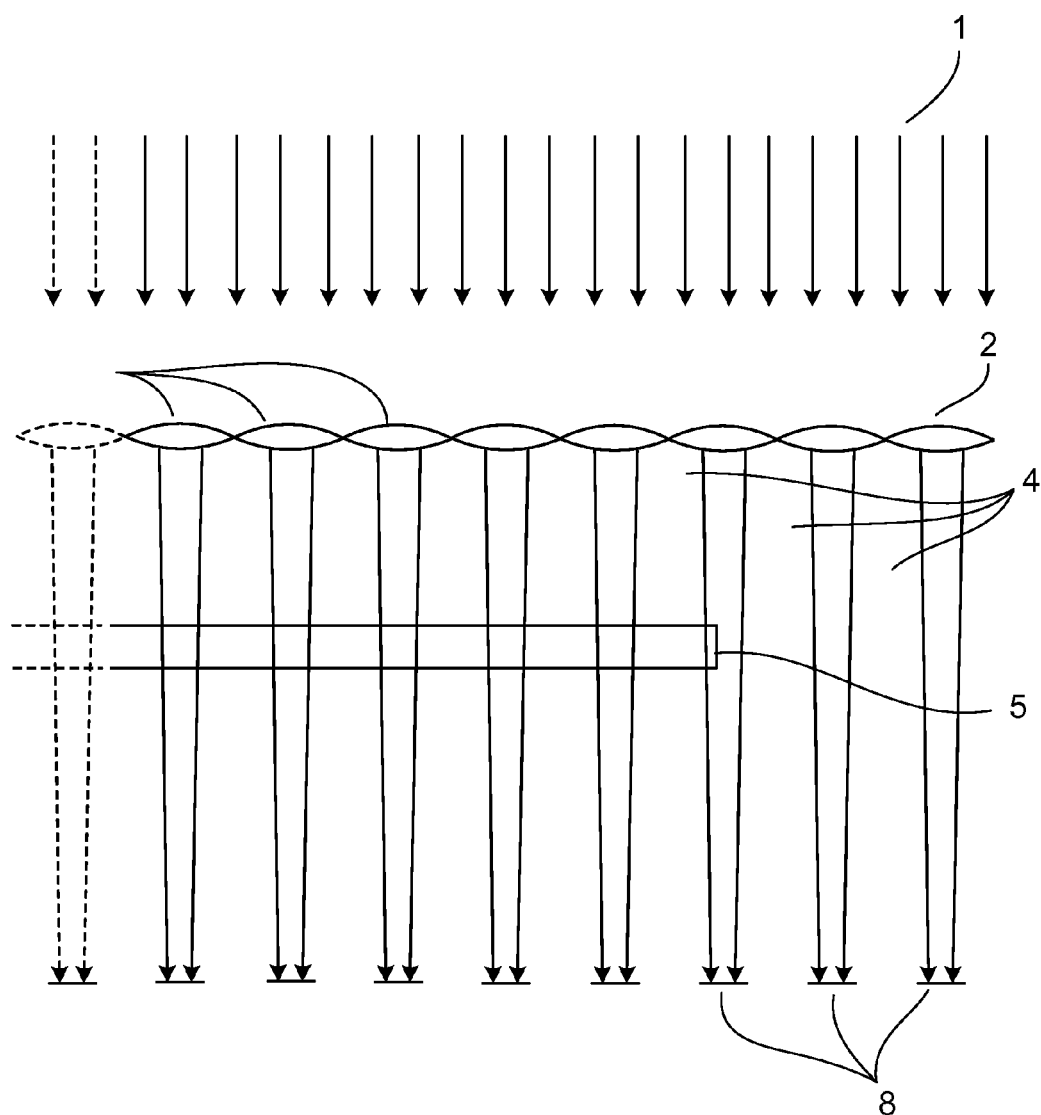
FIG. 1 shows part of an illumination unit of an embodiment of a projection exposure apparatus.

FIG. 1 shows part of an illumination unit of a projection exposure apparatus for microlithography, in which incident light 1 impinges on a so-called focussing array 2, that is to say an array of focussing lenses 3 arranged alongside one another and one behind another, in order to be converted into a corresponding beam arrangement composed of a multiplicity of light beams 4 arranged alongside one another two-dimensionally. The mirrors 8 of the multi-mirror array form an array of mirrors 8 arranged alongside one another two-dimensionally. By means of the mirrors 8 of the multi-mirror array 7, the light beams 4 can be deflected in the desired manner, in order to shape a light beam that is then used for the illumination of a reticle of a microlithography projection exposure apparatus.

In an arrangement of this type, a polarizer in the form of a polarization rotator plate 5 is provided, which ensures that linearly polarized light of the projection exposure apparatus can be altered by rotation of the polarization direction. The polarizer 5 can be brought into the beam path of the individual light beams 4 by means of a linear movement transversely with respect to the light beams 4 or by means of any other suitable movement, such as pivoting movements or the like, in order to bring about a rotation of the polarization direction for light beams 4 which pass through said polarizer.

Figure 2:
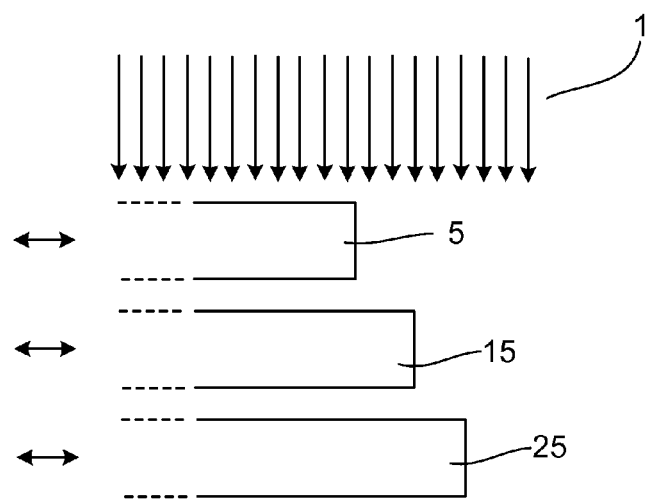
FIG. 2 shows an illustration of a further embodiment of an illumination unit of a projection exposure apparatus in a plan view similar to that from FIG. 1.

As is evident from FIG. 2, more particularly three polarizers 5, 15 and 25 are arranged one behind another in the beam direction of the light 1, which polarizers can be moved into the beam path and removed again separately and independently of one another.

Figure 3:
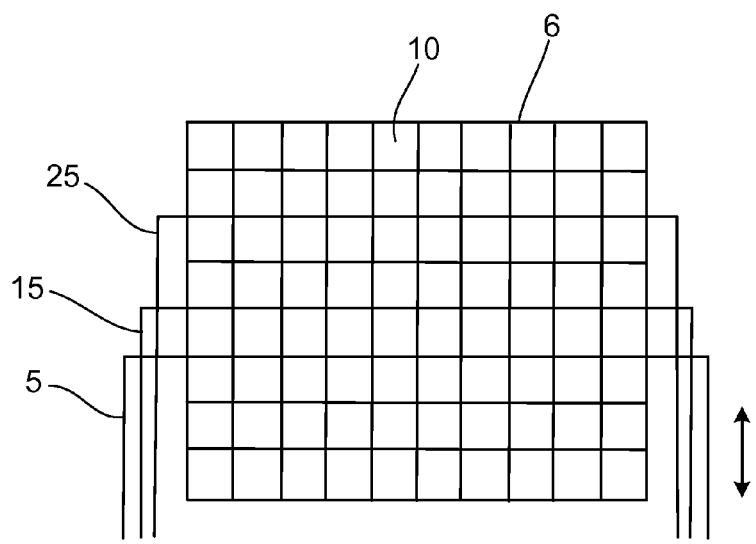
FIG. 3 shows a view of the apparatus from FIG. 2 rotated twice by 90° (side view rotated by 90° in the direction of the incident light)

FIG. 3 shows the arrangement of polarizers 5, 15 and 25 from the point of view of the incident light 1, wherein the illustration has additionally been rotated by 90° about the light incidence direction. Accordingly, the polarizer 5, only half of which has moved into the beam path composed of the multiplicity of light beams 4 arranged alongside one another, can be seen in the region of the lower half of FIG. 3, while the polarizer 15 that has moved somewhat further in can be seen above the polarizer 5, and the polarizer 25 that has moved in the most can be seen above the polarizers 15 and 5 in FIG. 3. For the light beams assigned to the individual mirrors 8 of the multi-mirror array, it is possible to define fictitious channels 10 which are arranged alongside one another two-dimensionally and through which the light beams pass.

Accordingly, in the case of a positioning of the polarizers 5, 15, 25 in accordance with the illustration in FIG. 3, the light beams running in the channels 10 of the two upper channel rows of the multi-mirror array 7 would not be influenced in terms of their polarization direction, since they do not pass through any of the polarizers 5, 15 and 25. The light beams that pass through the horizontal rows Nos. 3 and 4 (counted from the top) of channels 10 pass through the polarizer 25 and experience, for example, a rotation of the polarization direction by 45° through the polarization rotator plate of the polarizer 25.

The light beams that passes through the channels 10 of the row of channels arranged underneath passes not only through the polarizer 25 but also through the polarizer 15, such that overall a rotation of the polarization direction by 90° is effected even if the polarizer 15 comprises a pole rotator plate that brings about a rotation by 45° in the same direction as the polarizer 25.

Accordingly, the light beams that pass through the channels 10 in the lower three channel rows illustrated are influenced, for example rotated, three times in their polarization direction as a result of successively passing through three polarizers, namely the polarizers 5, 15 and 25.

As a result of the displacement of the polarizers 5, 15, 25, the light beams that pass through different channels 10 can then be influenced in their polarization direction in a targeted manner. Accordingly, it is necessary that the polarizers 5, 15, 25 can be positioned exactly.

Figure 4:
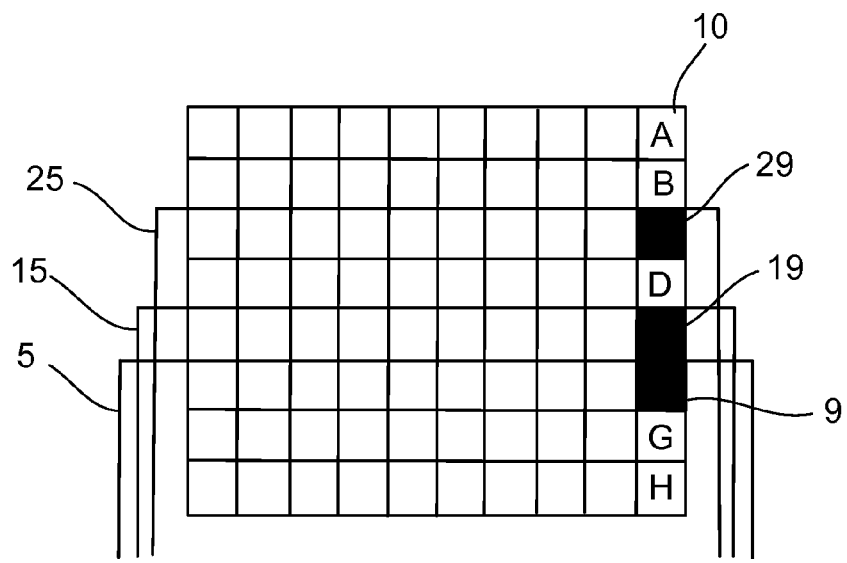
FIG. 4 shows an illustration similar to FIG. 3 with identification of the light-absorbing regions.

For this purpose, the polarizers 5, 15, 25 include light-absorbing regions 9, 19, 29, for example in the form of a deposited metal layer, such as, for example, chromium or the like. In the exemplary embodiment shown in FIG. 4, the light-absorbing regions 9, 19, 29 are provided at the same location in each case at the polarizers 5, 15, 25 namely at the top right corner of the pole rotator plates in the exemplary embodiment shown.

Figure 5:
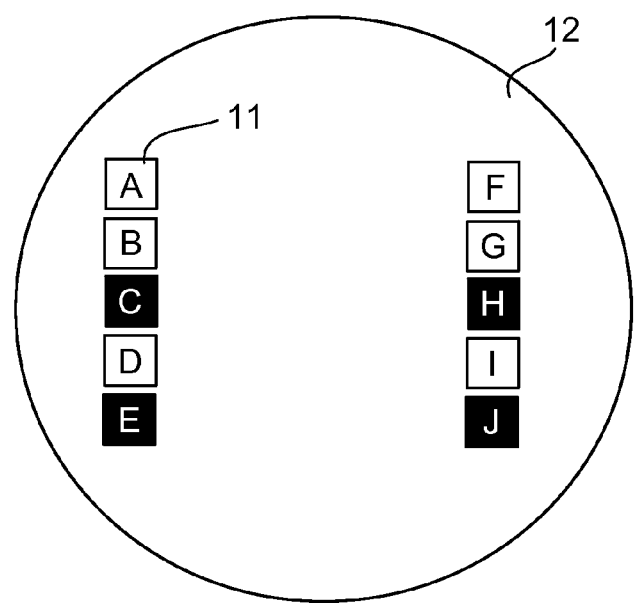
FIG. 5 shows an illustration of a pupil plane associated with the illumination unit shown in FIG. 4, with identification of the mutually associated channels of the beam path and regions of the pupil plane.

As is evident from FIG. 5, a specific region 11 can be assigned to each channel 10 in the pupil plane 12, which is identified by the same designation with upper-case letters A to H.

A measuring device can now be arranged in the pupil plane 12, said measuring device detecting the light intensity. Such a measuring device may, for example, already be provided for other purposes, too, in the projection exposure apparatus. By virtue of the light-absorbing regions 9, 19 and 29, which are arranged in the region of the channels C, E and F, no or a lower radiation intensity can be ascertained in the pupil plane 12 in the regions 11 identified by C, E and F, such that, by means of a corresponding control and/or evaluation unit, more particularly in the form of a data processing device which is set up accordingly in terms of programming, it is possible to ascertain that the polarizers 5, 15, 25 have to be positioned with their light-absorbing regions 9, 19, 29 in corresponding positions in the beam path.

However, since the light-absorbing regions 9, 19, 29 of the polarizers 5, 15, 25 are provided at in each case the same location of the polarizer 5, 15, 25, from the measurement of the light intensity in the pupil plane 12 it is not possible directly to ascertain which polarizer is responsible for the covering of which region 11 in the pupil plane 12. However, this can be determined during initial adjustment and subsequent tracking of the movements of the polarizers 5, 15, 25.

Figure 6:
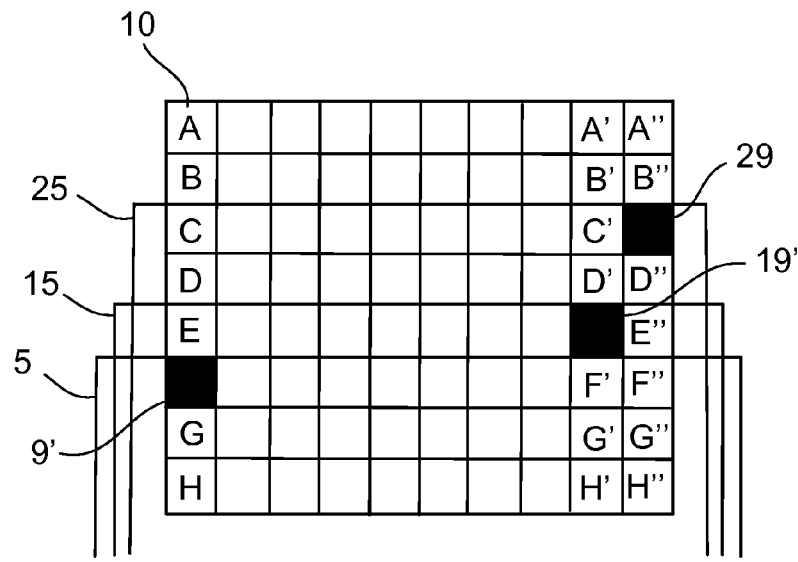
FIG. 6 shows an illustration of a further embodiment of an illumination unit of a projection exposure apparatus in accordance with the illustration in FIGS. 3 and 4 with identification of the light-absorbing regions.

Alternatively, the light-absorbing regions 9, 19, 29 of the polarizers 5, 15, 25 arranged one behind another can be provided at different locations of the polarizers 5, 15, 25, as is shown for the light-absorbing regions 9', 19', 29 in FIG. 6. While the light-absorbing region 29 of the polarizer 25 is once again arranged at the top right corner of the pole rotator plate, as in the exemplary embodiment in FIG. 4, the light-absorbing regions 9' of the polarizer 5 and 19' of the polarizer 15 are arranged at other locations, to be precise more particularly in a region which is offset by at least one channel width with respect to the other light-absorbing regions of the remaining polarizers.

Accordingly, the polarizer 5, in the case of an inward and outward movement, will cover with its light-absorbing region 9' only the channels 10 designated by the upper-case letter A to H, while the polarizer 15 can cover with its light-absorbing region 19' the channels 10 having the designations A' to H' and the polarizer 25 can cover with its light-absorbing region 29 the channels 10 identified by A" to H". Accordingly, in the pupil plane, the shadings caused by the light-absorbing regions 9', 19', 29 can be precisely separated from one another, since no overlap can take place, as is the case for example in the exemplary embodiment in FIG. 5.

Figure 7:
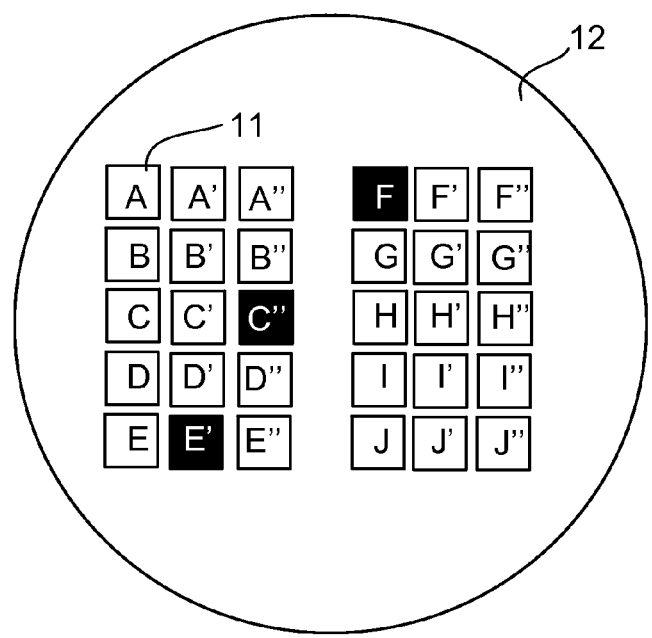
FIG. 7 shows an illustration of a pupil plane associated with the illumination unit in FIG. 6, with identification of the mutually associated channels of the beam path and regions of the pupil plane.

The position of the individual polarizers 5, 15 and 25 can be determined by the detection of the light intensity in the pupil plane 12 and the movement of the polarizers 5, 15 and 25 can be controlled accordingly. If it is provided, for example, that the polarizer 5, as shown in FIG. 6, is intended to be moved into the beam path of the beam arrangement to an extent such that the beams that are guided through the lower three rows of channels 10 are intended to pass through the polarizer 5, then the light-absorbing region 9' is arranged in the region of the channel 10 identified by the upper-case letter F. For this purpose, the polarizer 5 is driven by a drive device, such as, for example, a stepper motor or the like, to carry out a linear movement until the measuring device in the pupil plane 12 ascertains that the region 11 identified by the upper-case letter F in FIG. 7 is now covered by the light-absorbing region 9', such that no or little light intensity can be ascertained. Accordingly, the movement of the polarizer 5 can then be stopped and the polarizer 5 is arranged in the correct position. As a result, it is possible to use a drive device of simple design, such as a stepper motor, for example, for exact positioning of the polarizer 5. The corresponding polarizers 15 and 25 are controlled and moved in a similar way.

Figure 8:
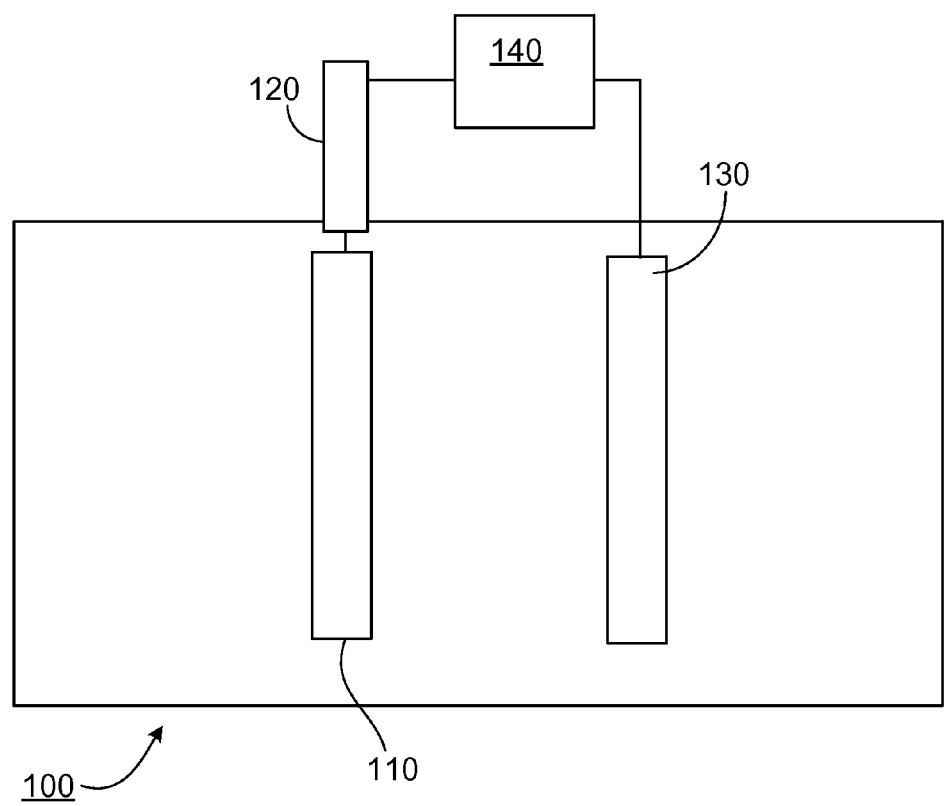
FIG. 8 is a schematic illustration of a projection objective.
Figure 1:
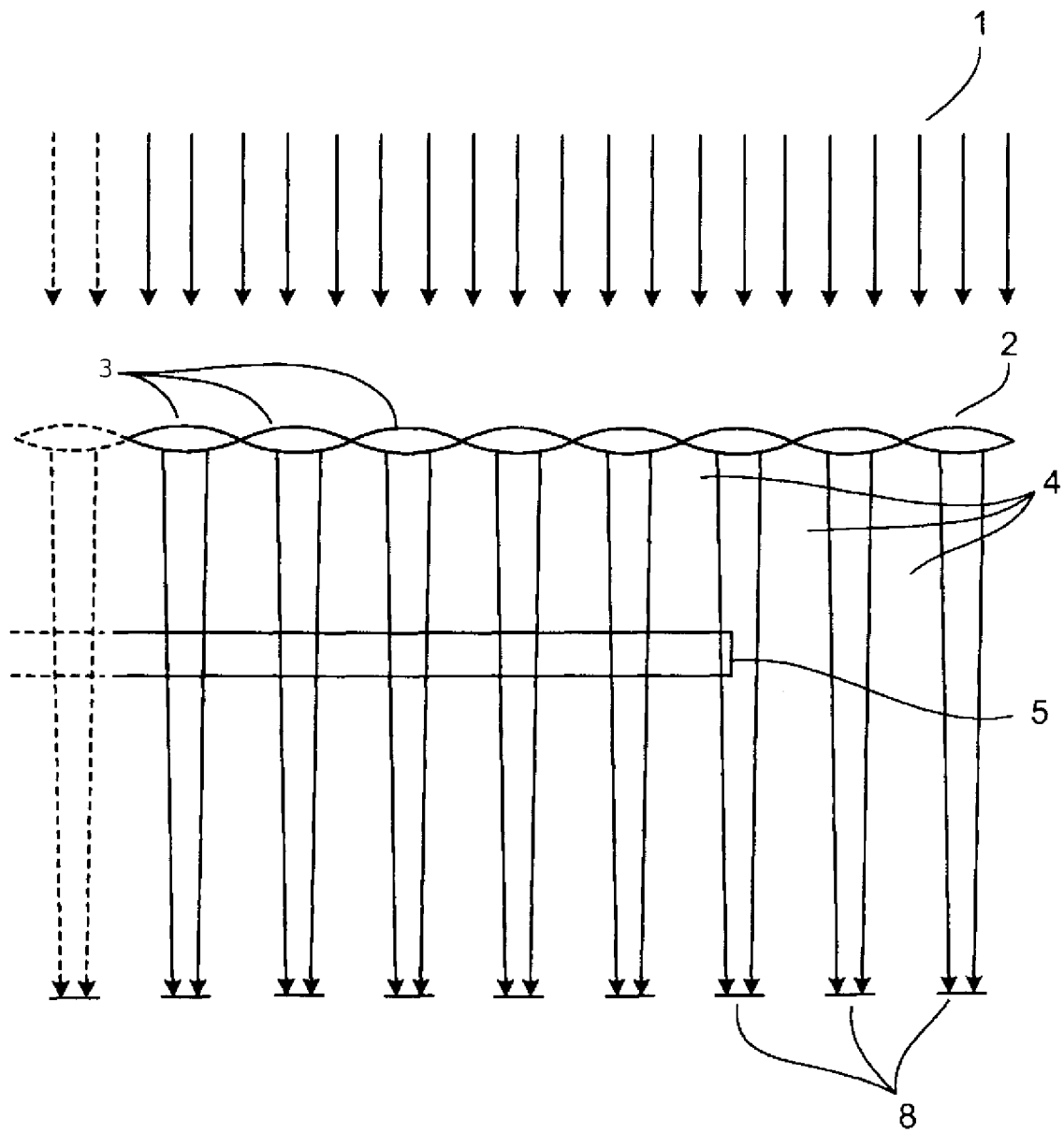

FIG. 8 is a schematic illustration of a projection objective 100 which includes an optical element 110 having a light-absorbing region, a drive device 120, a measuring device 130 and a control unit 140.

Other embodiments are in the following claims.

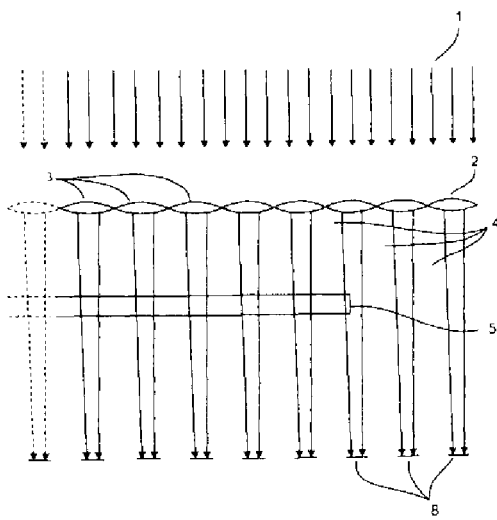

What is claimed is:

1. An apparatus for influencing a light beam arrangement that comprises a plurality of light beams arranged alongside one another, the apparatus comprising:

at least one optical element which is movable transversely with respect to the light beams and by which the light beams can be influenced if the light beams pass through the optical element, the at least one optical element comprising at least one light-absorbing region;
a drive device for the optical element;
a measuring device for detecting the light of the light beams; and
a control unit configured to determine a position of the light absorbing-region based on light detected by the measuring device,
wherein the control unit is configured to control the drive device in a manner dependent on the position of the light-absorbing region.

2. The apparatus of claim 1, further comprising a plurality of optical elements including the at least one optical element, wherein the plurality of optical elements are arranged one behind another in the beam direction of the light beams, the plurality of optical elements being movable individually or altogether.

3. The apparatus of claim 2 wherein the plurality of elements each comprise a light-absorbing region, the light absorbing regions being arranged at the same location of each of the optical elements or being arranged such that they do not overlap in any position of the optical elements in the beam direction of the light beams.

4. The apparatus of claim 1, wherein the drive device is a stepper motor.

5. The apparatus of claim 1, wherein the optical element is a polarizer.

6. A projection exposure apparatus for microlithography comprising:

a multi-mirror array which is illuminated by a plurality of light beams such that, in a pupil plane of the projection exposure apparatus, a respective region is assigned to a plurality of light beams, the projection exposure apparatus comprising an apparatus according to claim 1.

7. The projection exposure apparatus of claim 6, wherein the measuring device is formed by a device for measuring the light intensity in the pupil plane.

8. A method for influencing a light beam arrangement comprising a plurality of light beams, arranged alongside one another, with an apparatus according to claim 1, the method comprising:

providing at least one optical element which is movable transversely with respect to the light beams and by which the light beams are influenced if the light beams pass through the optical element, the at least one optical element comprising at least one light-absorbing region;
providing a drive device for the optical element; and
providing a measuring device for detecting the light of the light beams,
wherein the optical element is driven in a manner dependent on the position of the light-absorbing region such that the optical element assumes a position in which the desired light beams are influenced.

* * * * *

UNITED STATES PATENT AND TRADEMARK OFFICE
CERTIFICATE OF CORRECTION

PATENT NO. : 8,373,847 B2
APPLICATION NO. : 13/281179
DATED : February 12, 2013
INVENTOR(S) : Patra Page 1 of 3

It is certified that error appears in the above-identified patent and that said Letters Patent is hereby corrected as shown below:

The title page showing the illustrative figure should be replaced with the attached title page.

On the title page, Item [57] Abstract, delete "The present invention relates to an apparatus...or the projection exposure apparatus." Should read --An apparatus for influencing a light beam arrangement including a plurality of light beams arranged alongside one another, wherein provision is made of at least one optical element which is movable transversely with respect to the light beams and by which the light beams can be influenced if the light beams pass through the optical element, and which has at least one light-absorbing region. The apparatus comprises a drive device for the optical element, a measuring device for detecting the light of the light beam and a control unit, wherein the control unit is designed such that the drive device is controlled in a manner dependent on the position of the light-absorbing region.--

In the drawing, figure 1 should be replaced with the corrected figure 1 as shown on the attached page.

Signed and Sealed this
Eleventh Day of March, 2014

Michelle K. Lee
*Deputy Director of the United States Patent and Trademark Office*

(12) United States Patent
Patra et al.

(10) Patent No.: US 8,373,847 B2
(45) Date of Patent: Feb. 12, 2013

(54) POLARIZATION ACTUATOR

(75) Inventors: Michael Patra, Oberkochen (DE); Martin Meier, Heidenheim (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 13/281,179

(22) Filed: Oct. 25, 2011

(65) Prior Publication Data
US 2012/0099093 A1 Apr. 26, 2012

(30) Foreign Application Priority Data

Oct. 26, 2010 (DE) .................. 10 2010 042 901

(51) Int. Cl.
*G03B 27/72* (2006.01)
*G03B 27/54* (2006.01)
(52) U.S. Cl. .................. 355/71; 355/67
(58) Field of Classification Search .......... 355/53, 355/55, 67–71; 362/254, 393
See application file for complete search history.

(56) References Cited

U.S. PATENT DOCUMENTS

| | | | |
|---|---|---|---|
| 5,087,985 A * | 2/1992 | Kitaura et al. | 359/350 |
| 6,404,499 B1 | 6/2002 | Stoeldraijer et al. | |
| 6,535,274 B2 * | 3/2003 | Antoni | 355/67 |
| 7,551,263 B2 * | 6/2009 | Gruner et al. | 355/71 |
| 7,697,116 B2 * | 4/2010 | Dierichs et al. | 355/71 |
| 7,817,361 B2 * | 10/2010 | Mimura et al. | 359/885 |
| 7,999,916 B2 * | 8/2011 | Heil | 355/67 |
| 8,025,427 B2 * | 9/2011 | Maul et al. | 362/293 |
| 2004/0239904 A1 | 12/2004 | Nishinaga | |

FOREIGN PATENT DOCUMENTS

| | | |
|---|---|---|
| DE | 100 43 315 C1 | 6/2002 |
| JP | 2000-058442 | 2/2000 |
| JP | 2001-313250 | 11/2001 |
| JP | 2002-072361 | 3/2002 |
| JP | 2002-093700 | 3/2002 |
| JP | 2002-100561 | 4/2002 |

OTHER PUBLICATIONS

German Office Action, with english translation, for corresponding DE Appl. No. 10 2010 042 901.5, dated Jun. 7, 2011.
Japanese Office Action and English Translation of Japanese Office Action, for the corresponding Japanese Patent Application No. 2011-226221, dated Jan. 27, 2012.

* cited by examiner

*Primary Examiner* — Hung Henry Nguyen
(74) *Attorney, Agent, or Firm* — Fish & Richardson P.C.

(57) ABSTRACT

The present invention relates to an apparatus for influencing a light beam arrangement comprising a plurality of light beams (4) arranged alongside one another, wherein provision is made of at least one optical element (5, 15, 25) which is movable transversely with respect to the light beams and by which the light beams can be influenced if the light beams pass through the optical element, and which has at least one light-absorbing region (9, 19, 29), wherein the apparatus comprises a drive device for the optical element, a measuring device for detecting the light of the light beam and a control unit, wherein the control unit is designed such that the drive device is controlled in a manner dependent on the position of the light-absorbing region. Furthermore, the present invention also relates to a projection exposure apparatus for microlithography comprising a multi-mirror array, in which the corresponding apparatus can be used, and to a method for operating the corresponding apparatus or the projection exposure apparatus.

8 Claims, 5 Drawing Sheets